United States Patent [19]

Wu

[11] Patent Number: 5,904,537
[45] Date of Patent: May 18, 1999

[54] METHOD OF MANUFACTURING A CROWN-FIN-PILLAR CAPACITOR FOR HIGH DENSITY DRAMS

[75] Inventor: Shye Lin Wu, Hsinchu, Taiwan

[73] Assignee: Powerchip Semiconductor Corp., Taiwan R.O.C., Taiwan

[21] Appl. No.: 08/751,450

[22] Filed: Nov. 18, 1996

[51] Int. Cl.$^6$ .................................................. H01L 21/20
[52] U.S. Cl. ............................................ 438/396; 438/253
[58] Field of Search ................... 148/DIG. 14; 257/307, 257/308; 438/253, 254, 396, 397, 212, 220, 430

[56] References Cited

U.S. PATENT DOCUMENTS

| | | | |
|---|---|---|---|
| 5,164,337 | 11/1992 | Ogawa et al. | 438/254 |
| 5,170,233 | 12/1992 | Liu et al. | 257/308 |
| 5,196,365 | 3/1993 | Gotou | 438/254 |
| 5,240,871 | 8/1993 | Doan et al. | 438/397 |
| 5,536,673 | 7/1996 | Hong et al. | 438/254 |
| 5,543,339 | 8/1996 | Roth et al. | 422/50 |
| 5,595,931 | 1/1997 | Kim | 438/387 |
| 5,637,523 | 6/1997 | Fazan et al. | 438/397 |
| 5,656,536 | 8/1997 | Wu | 438/397 |
| 5,702,974 | 12/1997 | Kim | 438/397 |
| 5,716,495 | 2/1998 | Butterbaugh et al. | 438/708 |
| 5,716,884 | 2/1998 | Hsue et al. | 438/254 |
| 5,766,994 | 6/1998 | Tseng | 438/254 |
| 5,770,499 | 6/1998 | Kwok et al. | 438/253 |

FOREIGN PATENT DOCUMENTS

| | | |
|---|---|---|
| 5-183122 | 7/1993 | Japan . |
| 6-196649 | 7/1994 | Japan . |

*Primary Examiner*—Peter Toby Brown
*Assistant Examiner*—Toniae M. Thomas
*Attorney, Agent, or Firm*—Pennie & Edmonds LLP

[57] ABSTRACT

A method of manufacturing crown shape capacitors for use in semiconductor memories. High etching selectivity between BPSG (borophosoilicate glass) and CVD-oxide (chemical vapor deposition oxide) is used to fabricate horizontal fins and a vertical pillar within a crown shaped capacitor. Utilizing the structure as a mold, the present invention can improve the performance of a capacitor by increasing the surface area of the capacitor. First, a composition layer consists of BPSG and silicon oxide formed on a substrate. A highly selective etching is used to etch the BPSG sublayers of the composition layer. Then, a contact hole is formed in the composition layer. Next, a first conductive layer is formed in the contact hole and a conductive spacers are formed on the side wall of the composition layer. Then, the composition layer is removed by BOE solution. Next, a dielectric film and a second conductive layer are respectively formed on the first conductive layer. Thus, a crown shape capacitor with a plurality of horizontal fins and a vertical pillar structure is formed.

35 Claims, 5 Drawing Sheets

METHOD OF MANUFACTURING A CROWN-FIN-PILLAR CAPACITOR FOR HIGH DENSITY DRAMS

FIELD OF THE INVENTION

The present invention relates to semiconductor capacitors, and more specifically, to a method of making a high capacitance memory cell capacitor.

BACKGROUND OF THE INVENTION

Great progress has been made in the manufacture of dynamic random access memory (DRAM) using high density integrated circuit technology. A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture. With the advent of Ultra Large Scale Intergrated (ULSI) DRAM devices, the sizes of memory cells has gotten smaller and smaller such that the area available for a single memory cell has become very small. This has caused a reduction in capacitor area, which in turn results in a reduction in cell capacitance.

In order to achieve high performance (i.e. high density), memory cells in DRAM technology must be scaled down to the submicrometer range. Thus, as the capacity of DRAMs has increased, the size of the memory cells must steadily decrease. The reduction in memory cell area is required for high density DRAMs. This causes reduction in capacitor area, resulting in the reduction of cell capacitance. For very small memory cells, planar capacitors become very difficult to use reliably. Specifically, as the size of the capacitor decreases, the capacitance of the capacitor also decreases. Similarly, the size of the charge capable of being stored by the capacitor decreases. This results in the capacitor being very susceptible to α particle radiation. Additionally, as the capacitance decreases, the charge held by storage capacitor must be refreshed often. A simple stacked capacitor can not provide sufficient capacitance, even with high dielectric $Ta_2O_5$ films as the capacitor insulator.

Prior art approaches to overcoming these problems have resulted in the development of the trench capacitor (see for example U.S. Pat. No. 5,374,580) and the stacked capacitor. The trench capacitor has the well-known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (see "A CAPACITOR-OVER-BIT-LINE CELL WITH HEMISPHERICAL-GRAIN STORGE NODE FOR 64 Mb DRAMs", M. Sakao etc. microelectronics research laboratories, NEC Corporation). The HSG-Si is depositioned by low pressure chemical vapor deposition method at the transition temperature from amorphous-Si to polycrystalline-Si. Further, a cylindrical capacitor using Hemispherical Grained Si havs been proposed (see "A NEW CYLINDRICAL CAPACITOR USING HEMISPHERICAL GRAINED Si FOR 256 Mb DRAMs", H. Watanabe et al., Tech Dig, Dec. 1992, pp. 259–262).

SUMMARY OF THE INVENTION

A method for manufacturing an integrated circuit capacitor is disclosed. The method comprises the steps of forming a dielectric layer layer on a semiconductor substrate, forming a first conductive layer on the dielectric layer, forming a composition layer on said first conductive layer, said composition layer including a plurality of sublayers, at least two of said sublayers.

A photoresist is pattern on the composition layer, then an etching is used to etch the compositon layer back until the first conductive layer is reached. Next, a highly selective etching process is used to etch the composition layer. In preferred embodiment, the selective etching step utilizes a low pressure HF vapor to selectively etch the compositon layer.

A photoresist is then patterned on the composition layer to define a contact hole region. Subsequently, an etching process is used to etch the composition layer, the first conductive layer and the dielectric layer back until the substrate is reached.

Next, a second conductive layer is deposited using a conventional LPCVD process over the first conductive layer, the composition layer. Next, a dry etching process is used to etch the second conductive layer to the dielectric layer. The second conductive layer is anisotropically etched back by dry etching, spacers are then created by the dry etching process.

The composition layer is stripped using a BOE (buffer oxide etching) solution to form a crown shaped structure with horizontal fins and vertical pillar that consists of the first conductive layer and the second conductive layer. The resulting structure is used as the bottom storage electrode of the capacitor. The next step is the deposition of a dielectric film along the surface of the first conductive layers and second conductive layer. The dielectric film is preferably formed of either a double film of nitride/oxide film, a triple film of oxide/nitride/oxide, or any other high dielectric film such as tantalum oxide ($Ta_2O_5$), BST, PZT.

Finally, a third conductive layer is deposited using a conventional LPCVD process over the dielectric film. The third conductive layer is used as the top storage electrode. Thus, a semiconductor capacitor comprising the top storage electrode, a dielectric, and the bottom storage electrode is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a capacitor for DRAM cell, which will improve capacitance of the DRAM due to increasing the surface area of the capacitor. Further, the present invention uses high etching selectivity between BPSG (borophosphosilicate glass) and CVD silicon dioxide to form a new crown-fin-pillar capacitor structure. As will be seen below, this technique can be used to form a crown shape capacitor with horizontal fins and a vertical pillar.

Figure 1:
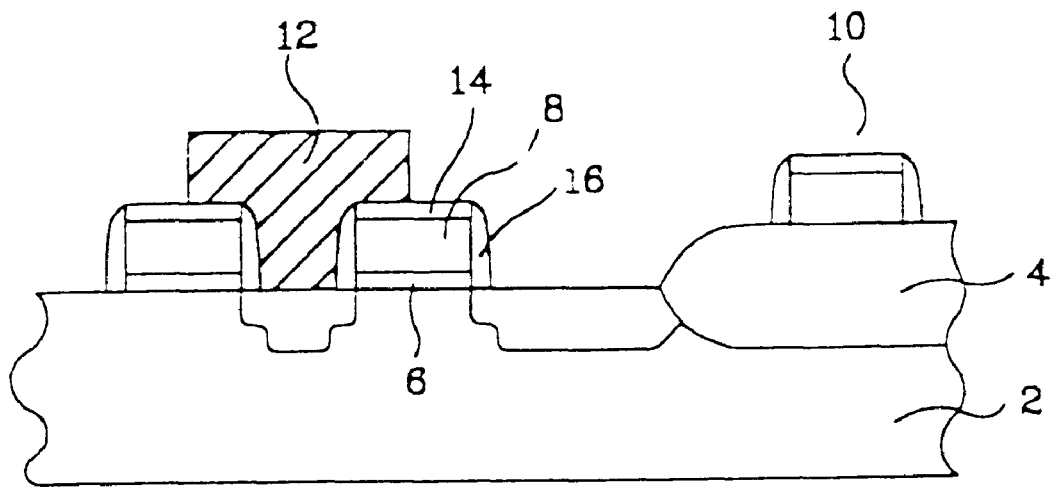
FIG. 1 is a cross section view of a semiconductor wafer illustrating the step of forming a gate structure on a semiconductor substrate.

Referring to FIG. 1, a single crystal P-type substrate 2 with a <100> crystallographic orientation is used for the preferred embodiment. A thick field oxide region 4, FOX 4, is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in an oxygen-steam ambient is used to form the FOX 4 region, to a thickness of about 3000–8000 angstroms.

Initially, a silicon dioxide layer 6 is created atop the substrate 2 to use as a gate oxide. In the preferred embodiment, the silicon dioxide layer 6 is formed by using an oxygen-steam ambient, at a temperature between about 800 to 1100° C. Alternatively, the gate oxide 6 may be formed using other known oxide chemical compositions and procedures. As is known in the art, the silicon dioxide layer 6 can be formed by using chemical vapor deposition (CVD) process, using TEOS (tetraethylorthosilicate) as a source at a temperature between about 600 to 800° C., at a pressure 1 to 10 torrs. In the preferred embodiment, the thickness of the silicon dioxide layer 6 is approximately 30–300 angstroms.

Still referring to FIG. 1, after the first silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness about 500–3000 angstroms. Then, a word line 10, gate structures with cap layer 14, and side wall spacers 16, a bit line 12 are formed by well known technology and is not particularly germane to the present invention. Thus, only a cursory description of the formation of gate structure is given here.

Figure 2:
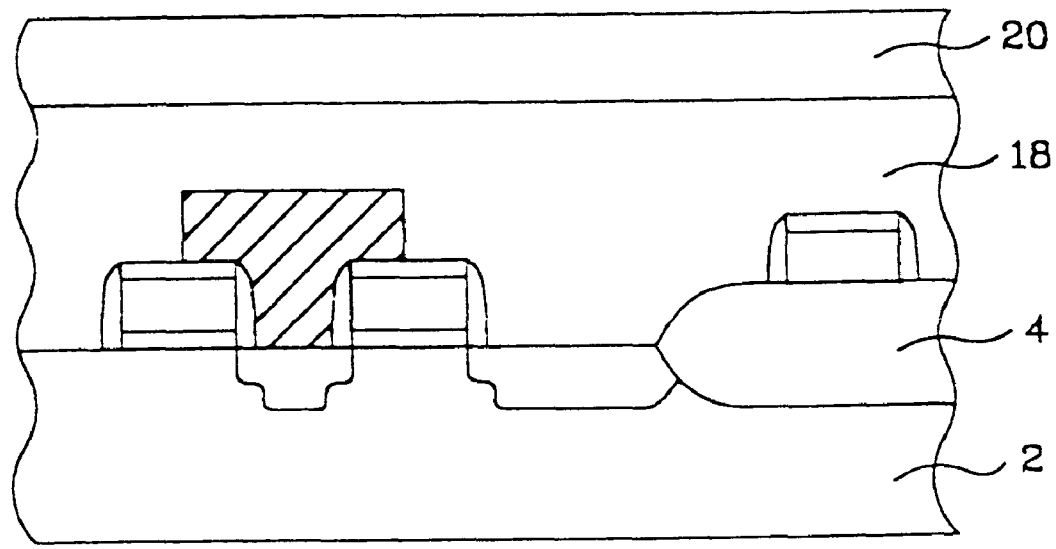
FIG. 2 is a cross section view of a semiconductor wafer illustrating the step of forming a dielectric layer, a first conductive layer on the semiconductor substrate.

As shown in FIG. 2, a dielectric layer 18 for isolation is formed on the gate structures, FOX 4 and substrate 2 to a thickness about 1000–10000 angstroms. The dielectric layer is preferably formed of TEOS-oxide. A first conductive layer 20 is subsequently formed on the dielectric layer 18. Any suitable material can be used for the first conductive layer such as doped polysilicon, in-situ doped polysilicon, silicide, platinum, copper, tungsten, or titanium. The first conductive layer 20 has a thickness at a range about 300–3000 angstroms.

Figure 3:
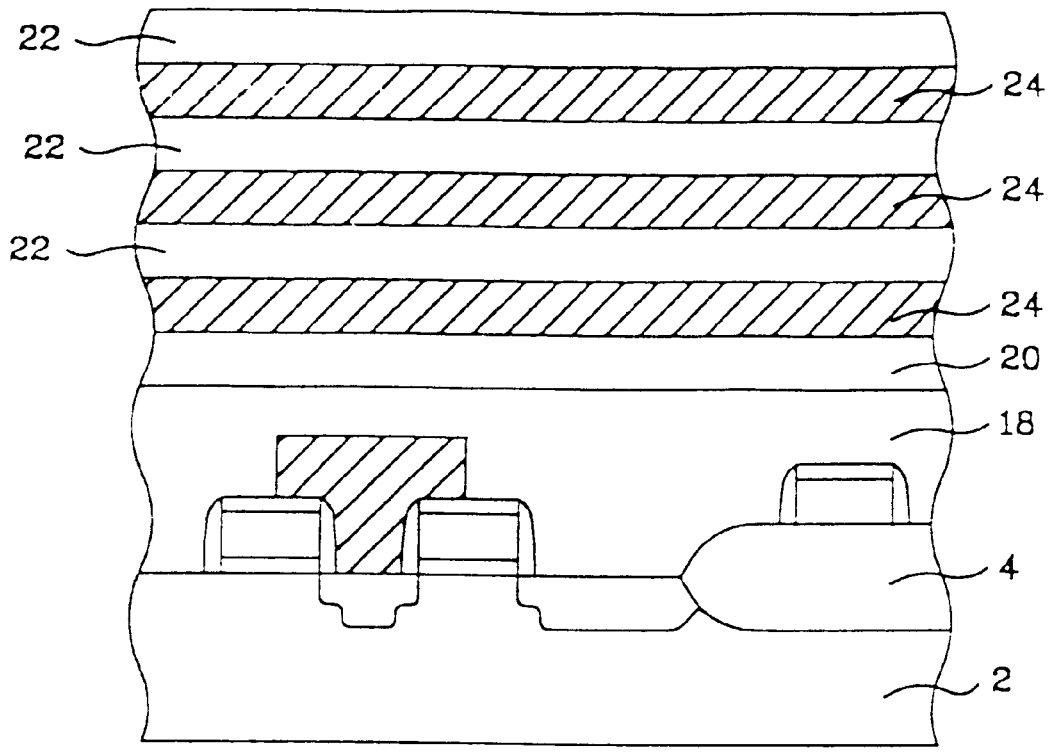
FIG. 3 is a cross section view of a semiconductor wafer illustrating the step of forming a composition layer consisting of alternating BPSG (borophosphosilicate glass) layers and CVD-oxide (chemical vapor deposition oxide) layers on the first conductive layer.

Turning next to FIG. 3, a composition layer consisting of alternating BPSG layers 22 and silicon dioxide layers 24 is formed on the first conductive layer 20. The composition layer can be formed on the first conductive layer 20 repeatedly by deposition. The composition layer is composed of odd layers and even layers. The odd layers may be silicon dioxide layers and the even layers may be BPSG, or alternatively, the odd layers may be BPSG and the even layers may be silicon dioxide layers. The BPSG layers 22 can be formed by low pressure chemical vapor deposition using tetraethylorthosilicate (TEOS) as a reactant. Boron and phosphorus are added during the formation of the borophosphosilicate glass layer. The thickness of the BPSG layers is 200 to 2000 angstroms. The silicon dioxide layers 24 can be formed by any suitable process auch as chemical vapor deposition process, using TEOS as a source at a temperature between about 600 to 800° C., at a pressure of 1 to 10 torrs, and to a thickness about 200 to 2000 angstroms.

Figure 4:
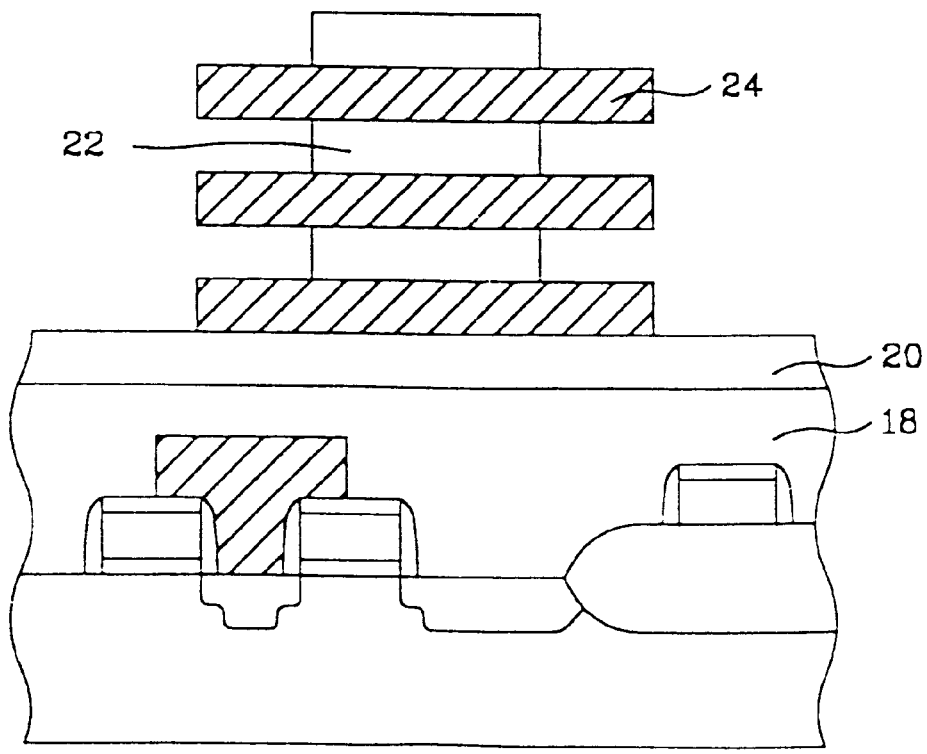
FIG. 4 is a cross section view of a semiconductor wafer illustrating the step of selectively etching the BPSG layers of the composition layer.

Turning next to FIG. 4, a photoresist is pattern on the composition layer, then an etching process is used to etch the compositon layer back until the first conductive layer 20 is reached. Next, still referring to FIG. 4, a selective etching step is performed. An important key of the present invention is that the susceptibility of BPSG to etching is much greater than that of silicon dioxide. In addition, the susceptability of BPSG to etching is also much greater than that of BSG, thus the BSG layer can be used to replace the silicon dioxide layer. In preferred embodiment, the selective etching step utilizes a low pressure HF vapor to selectively etch the BPSG layers 22 and silicon dioxide layers 24. The relative susceptibility to etching of the BPSG layers 22 to the silicon dioxide layers 24 is about 2000 to 1. (see "A New Cylindrical Using Hemispherical Grained Si for 256 Mb DRAMs", H. Watanabe,. 1992. IEEE). Therefore, the BPSG layers 22 is etched away much more significantly than the silicon dioxide layers 24, resulting in the structure of FIG. 4.

Figure 5:
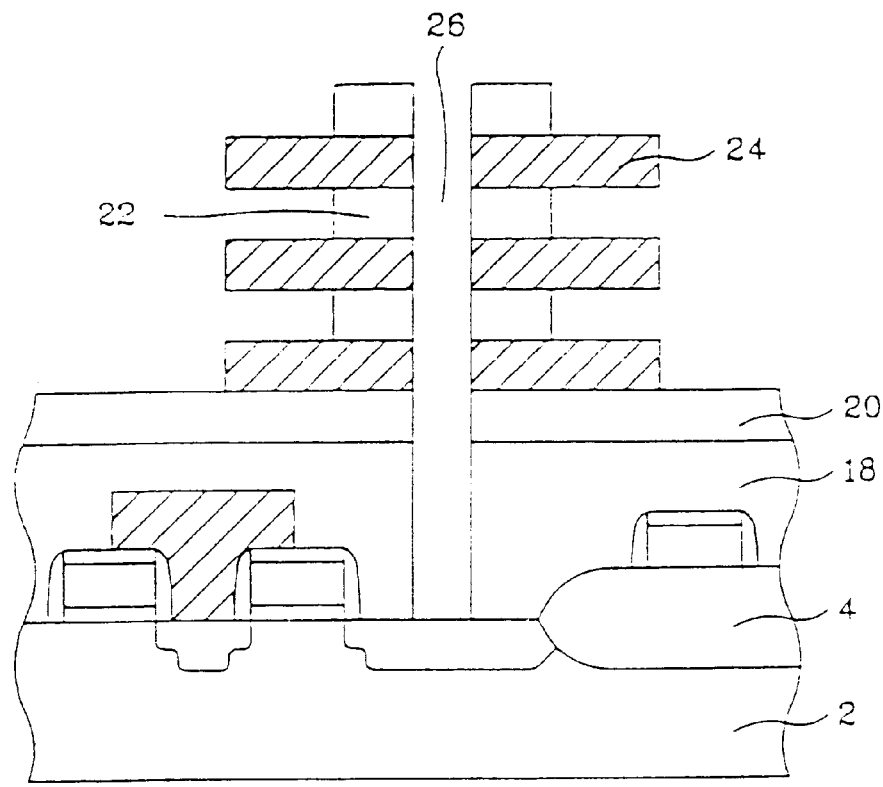
FIG. 5 is a cross section view of a semiconductor wafer illustrating the step of forming a contact hole in said composition layer, said first conductive layer and said dielectric layer.

Turning to FIG. 5, a photoresist is then patterned on the composition layer to define a contact hole region. Subsequently, an etching process is used to etch the composition layer, the first conductive layer 20 and the dielectric layer 18 back until the substrate 2 is reached. A dry etching process is used to achieve this purpose. The etchant to etch polysilicon is $SiCl_4/Cl_2$, $BCl_3/Cl_2$, $HBr/Cl_2/O_2$, $HBr/O_2$, $Br_2/SF_6$ or $SF_6$. The etchant oxide is selected from the group of $CCl_2F_2$, $CHF_3/CF_4$, $CHF_3/O_2$, $CH_3CHF_2$, $CF_4/O_2$. By controlling the recipe of the reaction gas the composition layer, the first conductive layer 20 and the dielectric layer 18 will be etched away respectively. A contact hole 26 is generated after the process.

Figure 6:
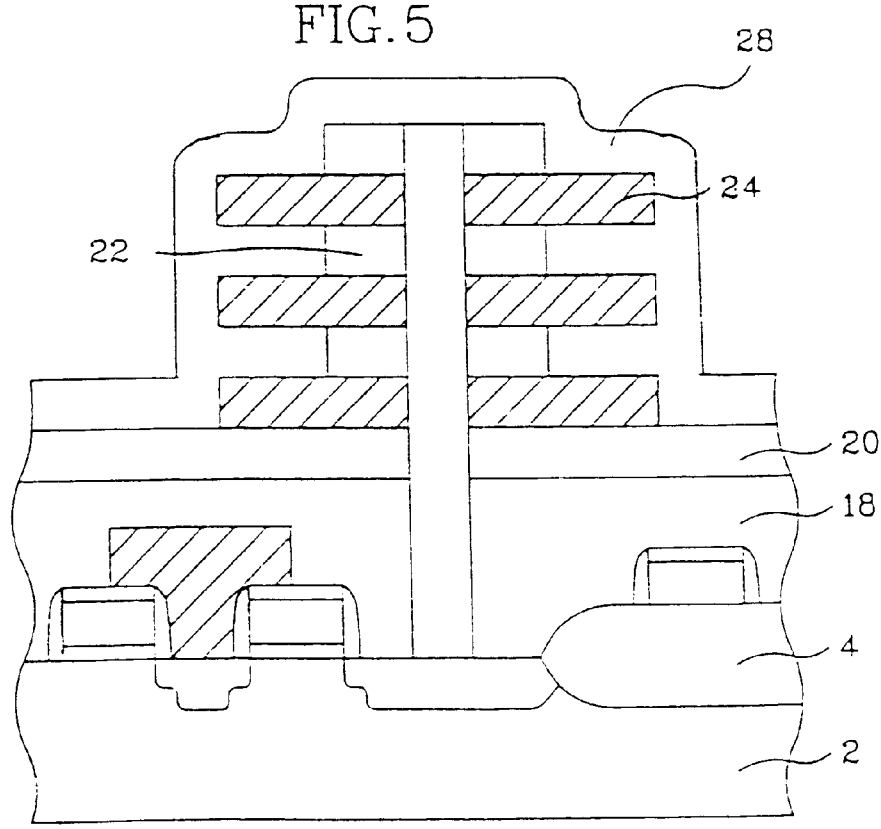
FIG. 6 is a cross section view of a semiconductor wafer illustrating the step of forming a second conductive layer.

Referring to FIG. 6, a second conductive layer 28 is deposited using well known process over the first conductive layer 20, the BPSG layers 22 and the silicon dioxide layers 24. Moreover, the second conductive layer 28 is also formed between the BPSG layers 22 and the silicon dioxide layers 24. The second conductive layer 28 has a thickness between 500 to 5000 angstroms. The second conductive layer 28 can be chosen from doped polysilicon, in-situ doped polysilicon, aluminum, copper, tungsten, or titanium.

Figure 7:
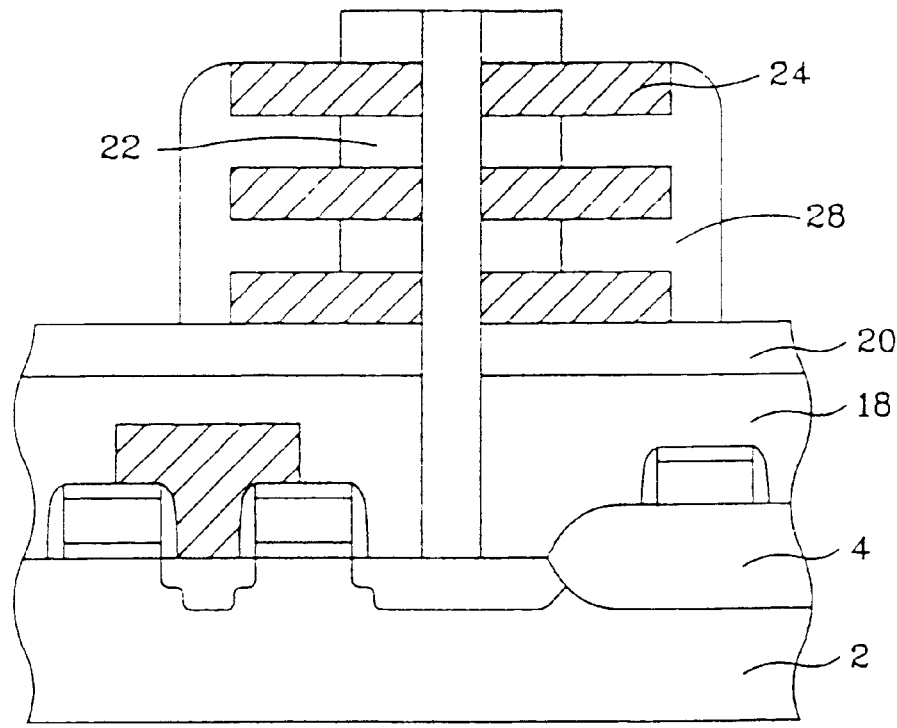
FIG. 7 is a cross section view of a semiconductor wafer illustrating the step of etching back the second conductive layer to form the spacer.

Next, as shown in FIG. 7, a dry etching process is used to etch the second conductive layer 28 and the first conductive layer 20 to the dielectric layer 18. The second conductive layer 28 is anisotropically etched back by dry etching, spacers 28a are then created.

Figure 8:
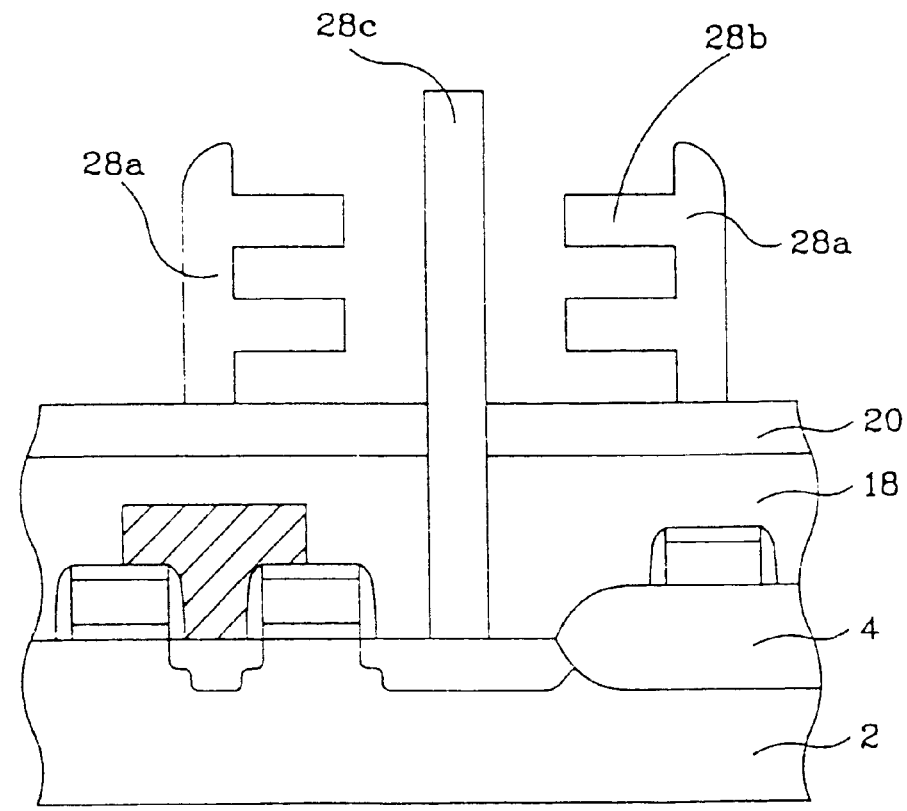
FIG. 8 is a cross section view of a semiconductor wafer illustrating the step of removing the BPSG and CVD silicon dioxide composition layers.

As can be seen in FIG. 8, the BPSG layers 22 and the silicon dioxide layers 24 are stripped using a BOE (buffer oxide etching) solution to form a crown shaped structure 28a with horizontal fins 28b and a vertical pillar 28c. The resulting structure is used as the bottom storage electrode of the capacitor.

Figure 9:
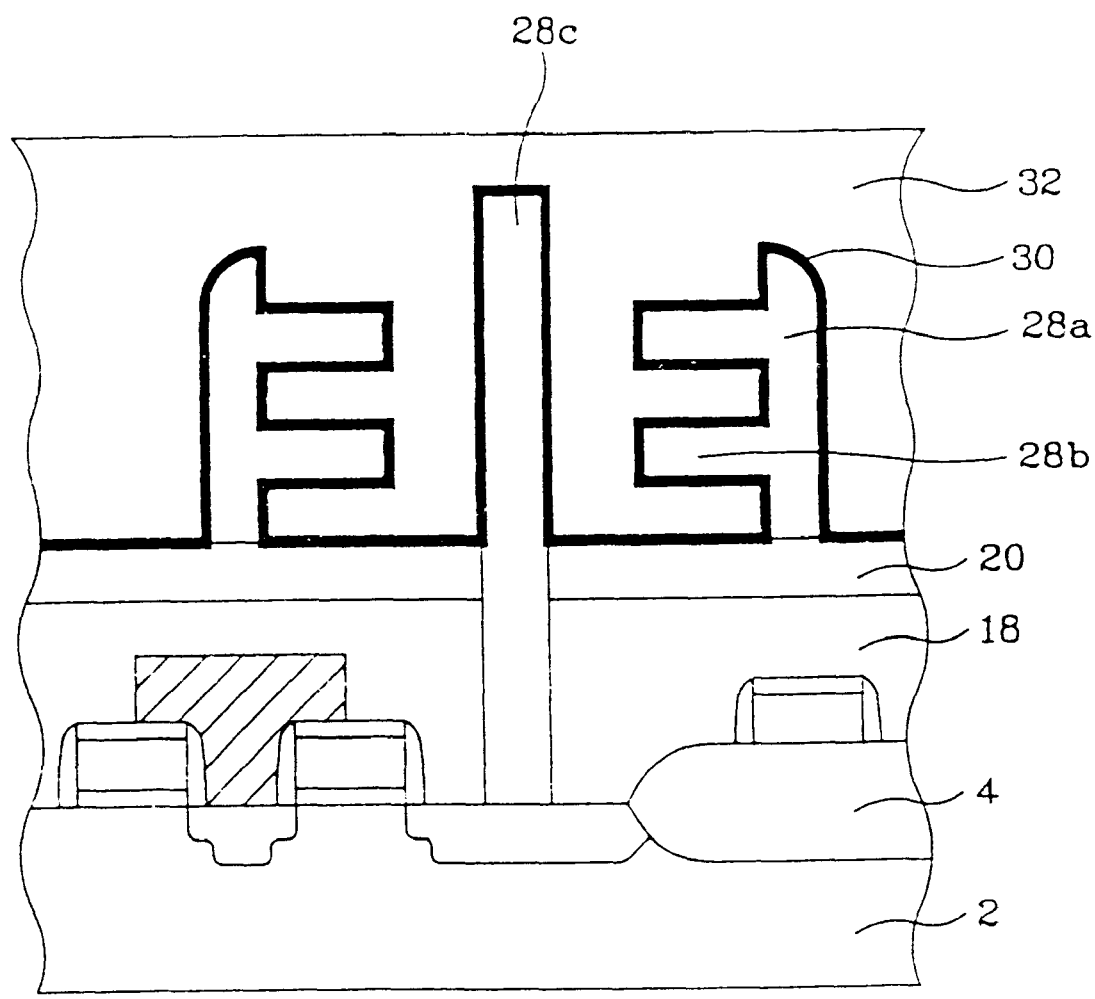
FIG. 9 is a cross section view of a semiconductor wafer illustrating the step of forming a dielectric layer on the first conductive layer and the second conductive layer and forming a third conductive layer on the dielectric layer.

Turning next to FIG. 9, the next step is the deposition of a dielectric film 30 along the surface of the first conductive layers 20 and second conductive layer 28. The dielectric film 30 is preferably formed of either a double film of nitride/oxide film, a triple film of oxide/nitride/oxide, or any other high dielectric film such as tantalum oxide ($Ta_2O_5$), BST, PET, PLZT.

Finally, as shown in FIG. 9, a third conductive layer 32 is deposited using well known process over the dielectric film 30. The third conductive layer 32 is used as the top storage electrode and is formed of doped polysilicon, in-situ doped polysilicon, aluminum, copper, tungsten or titanium. Thus, a semiconductor capacitor comprising the top storage electrode, a dielectric 30, and the bottom storage electrode is formed.

The present invention thus provides capacitors with an enlarged surface area. The present invention uses the high etching selectivity between BPSG and CVD silicon dioxide to fabricate the capacitor. Moreover, the crown-fin-pillar shape structure increases the surface area of the capacitor. Therefore the present invention increases the performance of the capacitor.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:
    forming a first conductive layer over a semiconductor substrate;
    forming a composition layer with a plurality of sublayers on said first conductive layer, at least two of said sublayers having a susceptibility to etching that differs;
    forming a photoresist mask pattern atop said composition layer;
    removing said composition layer not protected by said photoresist mask pattern;
    selectively etching said composition layer;
    forming a contact hole through said composition layer, said first conductive layer to said substrate;
    forming a second conductive layer on said first conductive layer, in said contact hole and over said composition layer;
    forming spacers on the sides of said composition layer using etching process to etch said second conductive layer;
    removing said composition layer;
    forming a dielectric film on the surface of said first conductive layer and said second conductive layer; and
    forming a third conductive layer over said dielectric film.

2. The method of claim 1, further comprises a step of forming a dielectric layer on said substrate before forming said first conductive layer.

3. The method of claim 1, wherein said sublayers are further grouped into odd sublayers and even sublayers, and said odd sublayers are BPSG and said even sublayers are silicon dioxide.

4. The method of claim 1 wherein said sublayers are further grouped into odd sublayers and even sublayers, and said odd sublayers are BPSG and said even sublayers are BSG.

5. The method of claim 1, wherein said sublayers are further grouped into odd sublayers and even sublayers, and said even sublayers are BPSG and said odd sublayers are silicon dioxide.

6. The method of claim 1 wherein said sublayers are further grouped into odd sublayers and even sublayers, and said even sublayers are BPSG and said odd sublayers are BSG.

7. The method of claim 1, wherein said first conductive layer has a thickness about 500–3000 angstroms.

8. The method of claim 2, wherein said dielectric layer is formed of TEOS-oxide.

9. The method of claim 8, wherein said dielectric layer has a thickness about 1000–10000 angstroms.

10. The method of claim 3, wherein said BPSG sublayers have a thickness of a range between 300–2000 angstroms, said silicon dioxide layers have a thickness of a range between 300–2000 angstroms.

11. The method of claim 10, wherein the step of etching the composition layer is done with a low pressure HF vapor.

12. The method of claim 4, wherein said BPSG sublayers have a thickness of a range between 300–2000 angstroms, said BSG layers have a thickness of a range between 300–2000 angstroms.

13. The method of claim 12, wherein the step of etching the composition layer is done with a low pressure HF vapor.

14. The method of claim 5, wherein said BPSG sublayers have a thickness of a range between 300–2000 angstroms, said silicon dioxide layers have a thickness of a range between 300–2000 angstroms.

15. The method of claim 14, wherein the step of etching the composition layer is done with a low pressure HF vapor.

16. The method of claim 6, wherein said BPSG sublayers have a thickness of a range between 300–2000 angstroms, said BSG layers have a thickness of a range between 300–2000 angstroms.

17. The method of claim 16, wherein the step of etching the composition layer is done with a low pressure HF vapor.

18. The method of claim 1, after the step of etching said composition layers, further comprising the step of removing said photoresist.

19. The method of claim 1, wherein said second conductive layer is also formed between said plurality of sublayers.

20. The method of claim 1, wherein said second conductive layer has a thickness of a range between 500–5000 angstroms.

21. The method of claim 1, wherein the step of forming said spacer includes anisotropically etching back said second conductive layer.

22. The method of claim 1, wherein the step of removing said composition layer is done using a BOE (buffer oxide etching) solution.

23. The method of claim 1, wherein said dielectric film is formed of tantalum oxide ($Ta_2O_5$).

24. The method of claim 1, wherein said dielectric film is formed of a triple film of oxide/nitride/oxide.

25. The method of claim 1, wherein said dielectric film is formed of a double film of nitride/oxide film.

26. The method of claim 1, wherein said dielectric film is formed of BST.

27. The method of claim 1, wherein said dielectric film is formed of PZT or PLZT.

28. The method of claim 1, wherein said first conductive layer, said second conductive layer, said third conductive layer are selected from the group of doped polysilicon, in-situ doped polysilicon, aluminum, copper, tungsten, and titanium combinations thereof.

29. A method for manufacturing an integrated circuit capacitor, the method comprising the steps of:

forming a first conductive layer over a semiconductor substrate;

forming a composition layer that consists of alternating sublayers of BPSG sublayers and silicon dioxide on said first conductive layer;

patterning a photoresist on said composition layer;

etching said composition layer using said photoresist as an etching mask;

stripping said photoresist;

etching said composition layer using highly selective etching to etch said BPSG layers;

forming a contact hole through said composition layer, first conductive layer to substrate;

forming a second conductive layer on said substrate, in said contact hole and over said composition layer;

etching said second conductive layer to form spacers on the sides of said composition layer by anisotropically etching back said second conductive layer;

removing said composition layer;

forming a dielectric film on the surface of said first conductive layer and said second conductive layer; and forming a third conductive layer over said dielectric film.

30. The method of claim 29, wherein the step of etching the composition layer is done with a low pressure HF vapor.

31. The method of claim 29, wherein the step of removing said composition layer is done using a BOE (buffer oxide etching) solution.

32. The method of claim 29, wherein said BPSG sublayers have a thickness of a range between 300–2000 angstroms, said silicon dioxide layers have a thickness of a range between 300–2000 angstroms.

33. A method of forming a horizontal polysilicon fin and vertical pillar polysilicon comprising the steps of:

forming a first conduction layer on a substrate;

forming a composition layer that consists of alternating BPSG layers and silicon dioxide layers on the first conduction layer;

forming a photo resist mask pattern atop said composition layer;

removing said composition layer not protected by said photo resist mask pattern;

using high selective etching to etch said BPSG layers;

forming a contact hole through said composition layer to said substrate;

forming a polysilicon layer on said substrate, in said contact hole and over said composition layer;

etching said polysilicon layer to form spacers on outwardly facing sidewalls of said composition layer by anisotropically etching back said polysilicon layer; and removing said composition layer.

34. The method of claim 33, wherein the step of etching said BPSG layers is done with a low pressure HF vapor.

35. The method of claim 33, wherein the step of removing said composition layer is done using a BOE (buffer oxide etching) solution.

* * * * *